(12) United States Patent
Kim

(10) Patent No.: US 12,035,626 B2
(45) Date of Patent: Jul. 9, 2024

(54) THERMOELECTRIC DEVICE

(71) Applicant: LG INNOTEK CO., LTD., Seoul (KR)

(72) Inventor: Sung Chul Kim, Seoul (KR)

(73) Assignee: LG INNOTEK CO., LTD., Seoul (KR)

(*) Notice: Subject to any disclaimer, the term of this patent is extended or adjusted under 35 U.S.C. 154(b) by 73 days.

(21) Appl. No.: 17/426,737

(22) PCT Filed: Jan. 28, 2020

(86) PCT No.: PCT/KR2020/001255
§ 371 (c)(1),
(2) Date: Jul. 29, 2021

(87) PCT Pub. No.: WO2020/159177
PCT Pub. Date: Aug. 6, 2020

(65) Prior Publication Data
US 2022/0069190 A1    Mar. 3, 2022

(30) Foreign Application Priority Data
Jan. 30, 2019 (KR) .................. 10-2019-0011801

(51) Int. Cl.
*H10N 10/17* (2023.01)
*H10N 10/852* (2023.01)

(52) U.S. Cl.
CPC ........... *H10N 10/17* (2023.02); *H10N 10/852* (2023.02)

(58) Field of Classification Search
CPC .............................. H10N 10/17; H10N 10/852
See application file for complete search history.

(56) References Cited

U.S. PATENT DOCUMENTS

2013/0199593 A1    8/2013    Higashida et al.

FOREIGN PATENT DOCUMENTS

| JP | WO 2003/105244 | 12/2003 |
| JP | 2004-235367 A | 8/2004 |
| JP | 3592395 | 11/2004 |
| JP | 2008-066459 | 3/2008 |
| JP | 2017-041619 A | 2/2017 |
| KR | 10-0933904 | 12/2009 |
| KR | 10-2017-0084929 | 7/2017 |
| WO | WO-2012056411 A1 * | 5/2012 ............. H01L 35/32 |

OTHER PUBLICATIONS

Korean Office Action dated Dec. 20, 2022 issued in Application No. 10-2019-0011801.
International Search Report dated May 11, 2020 issued in Application No. PCT/KR2020/001255.
Japanese Office Action dated Nov. 28, 2023 issued in Application 2021-544616.

* cited by examiner

*Primary Examiner* — Tamir Ayad
(74) *Attorney, Agent, or Firm* — KED & Associates LLP

(57) ABSTRACT

A thermoelectric device of the present invention comprises a first substrate; first electrodes; a P-type thermoelectric leg; an N-type thermoelectric leg and an insulating leg; a second electrode; and a second substrate. The first and second electrodes comprises a plurality of electrodes, the insulating leg comprises a third plating layer, an insulating layer comprising a polymer resin, and a fourth plating layer. The modulus of elasticity of the insulating leg is 3 to 1000 MPa.

15 Claims, 10 Drawing Sheets

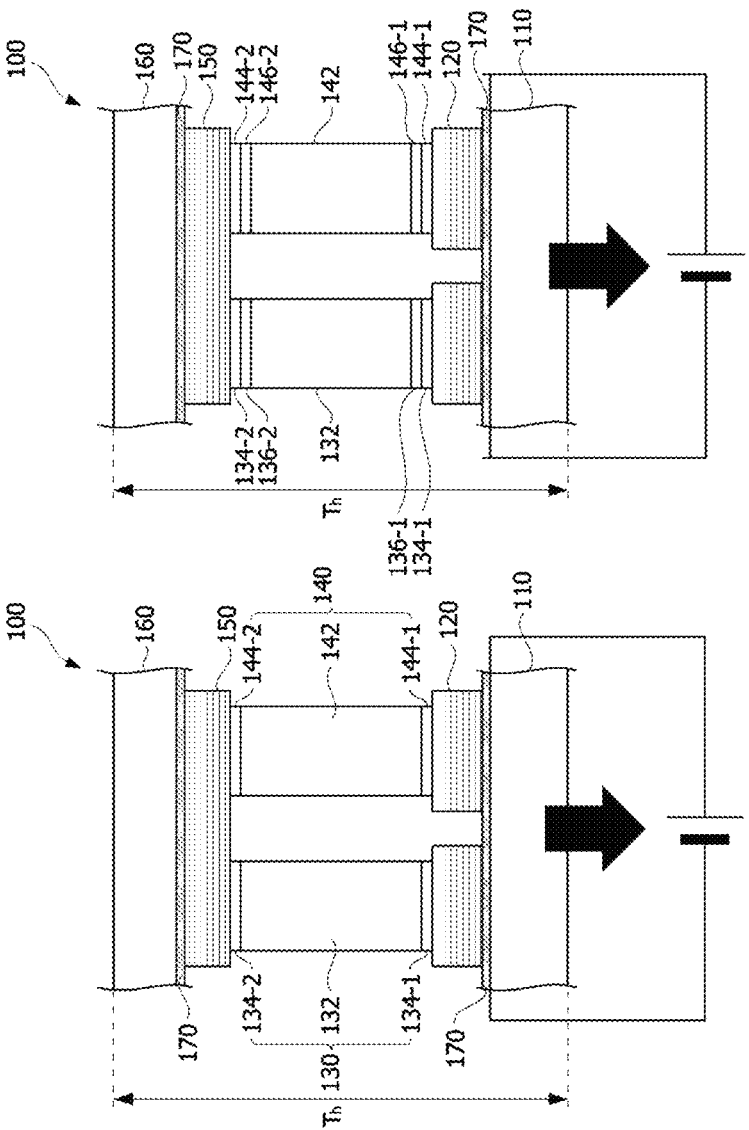

[FIG. 2]
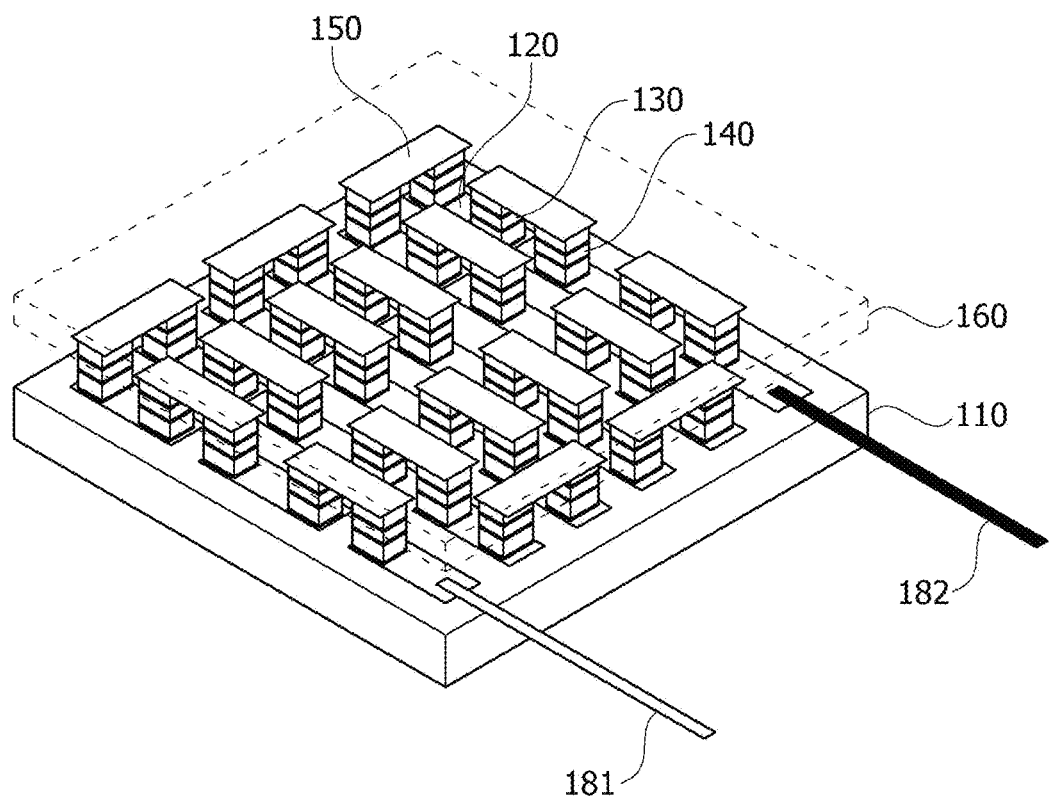

[FIG. 3]
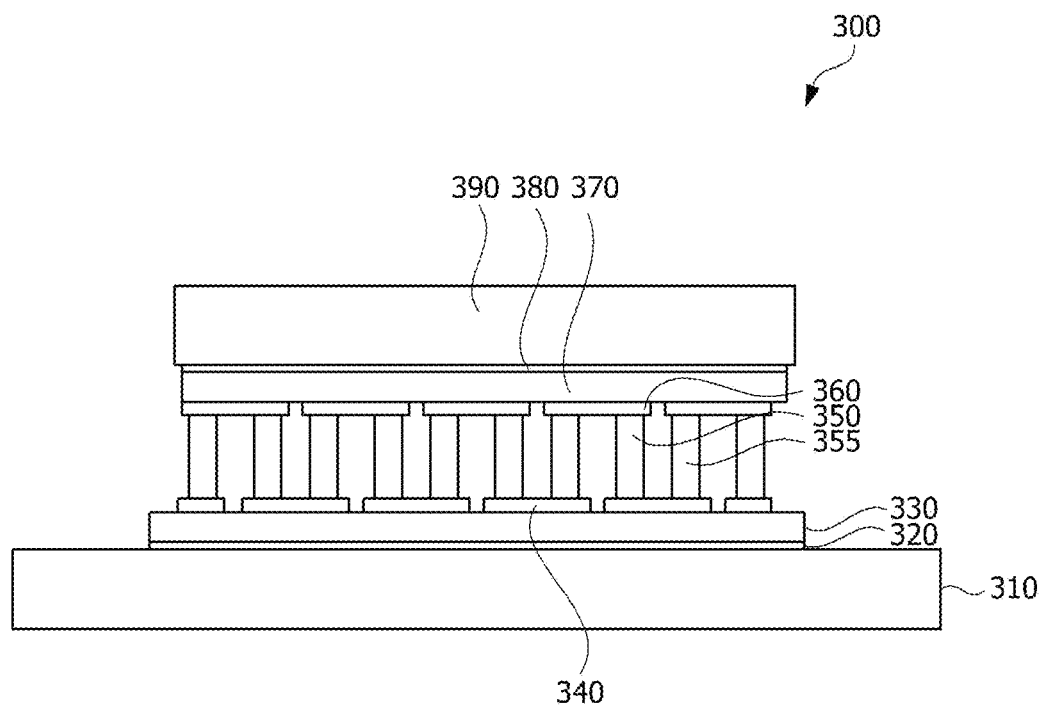

[FIG. 4]
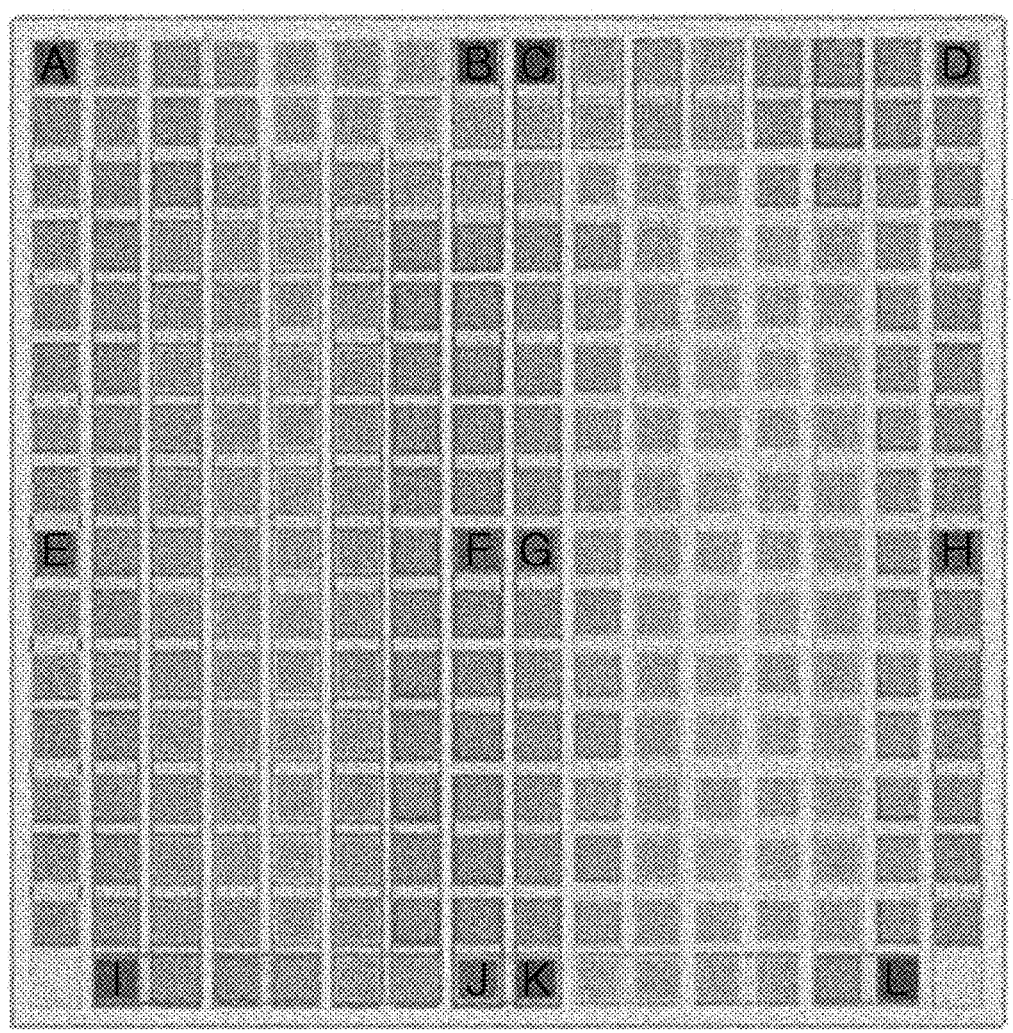

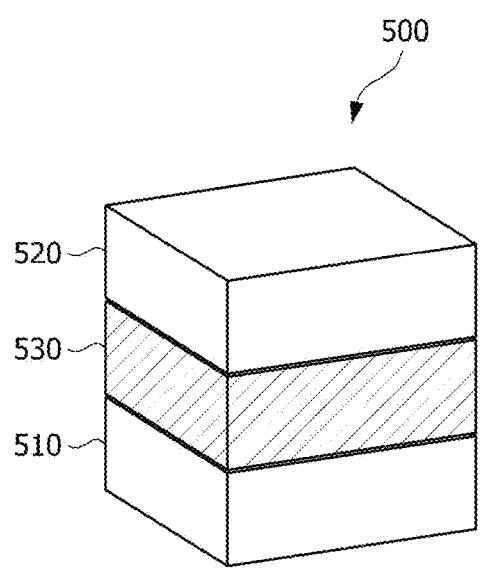
[FIG. 5A]
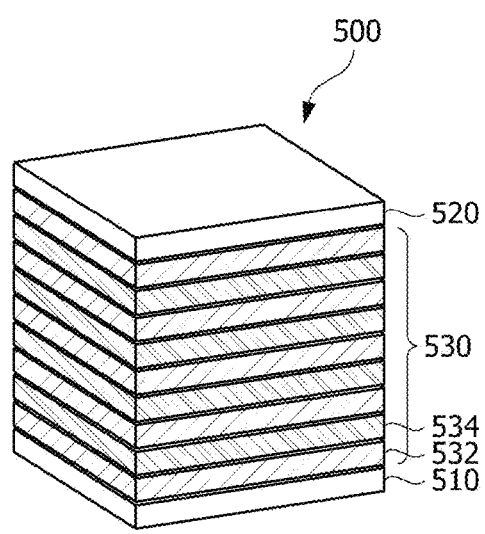
[FIG. 5B]

[FIG. 6]
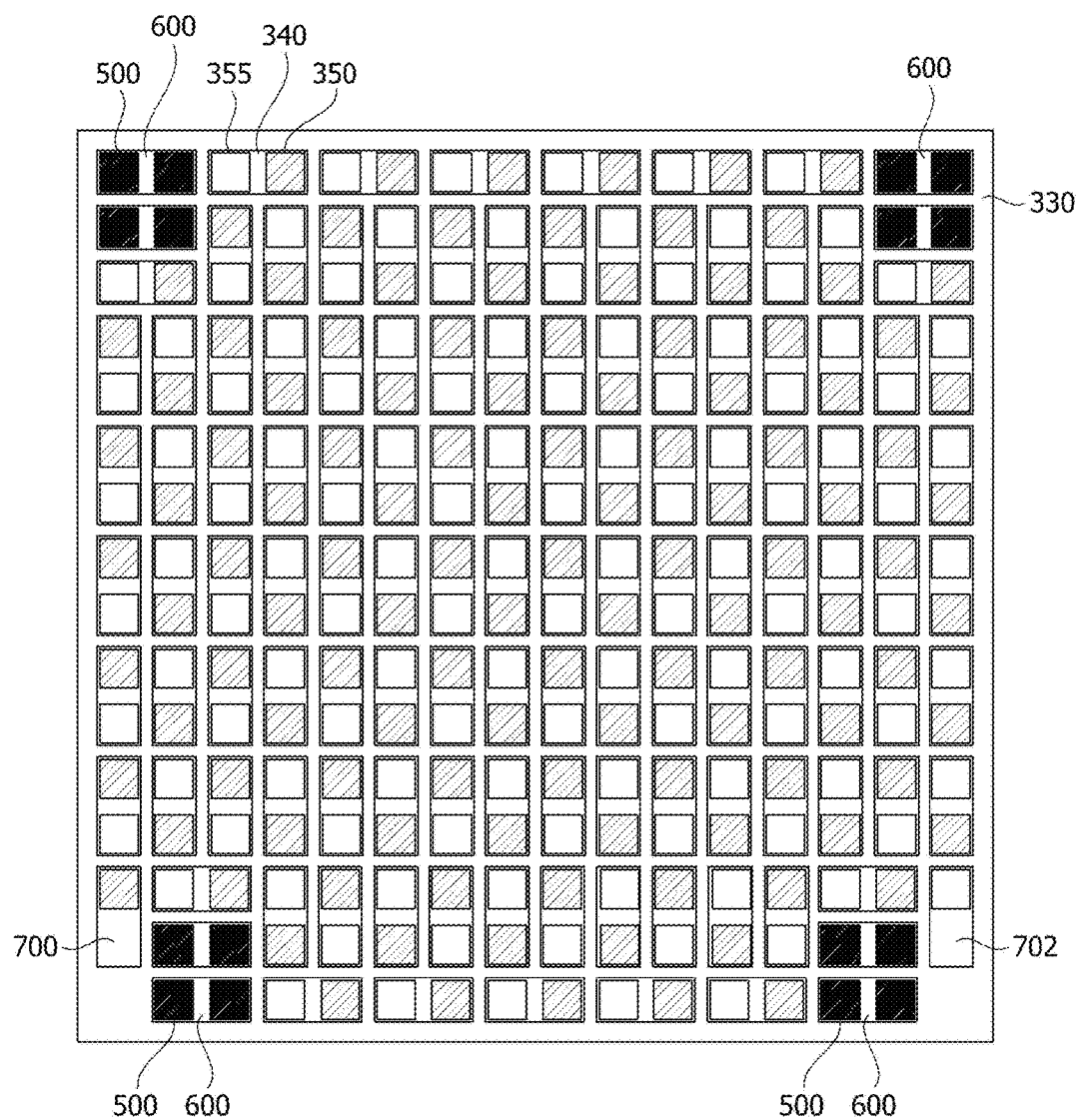

[FIG. 7]
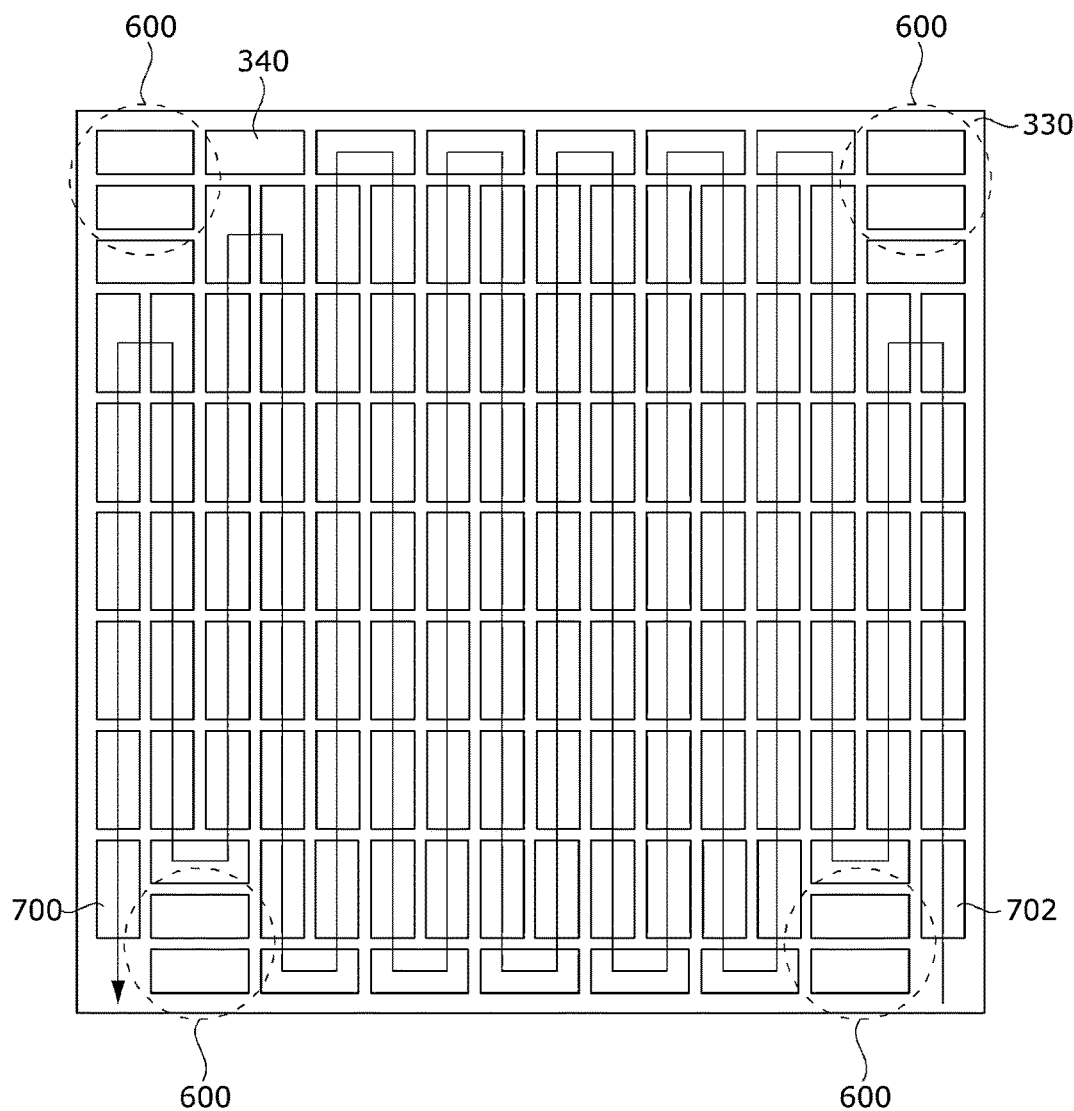
→ : CURRENT DIRECTION

[FIG. 8]
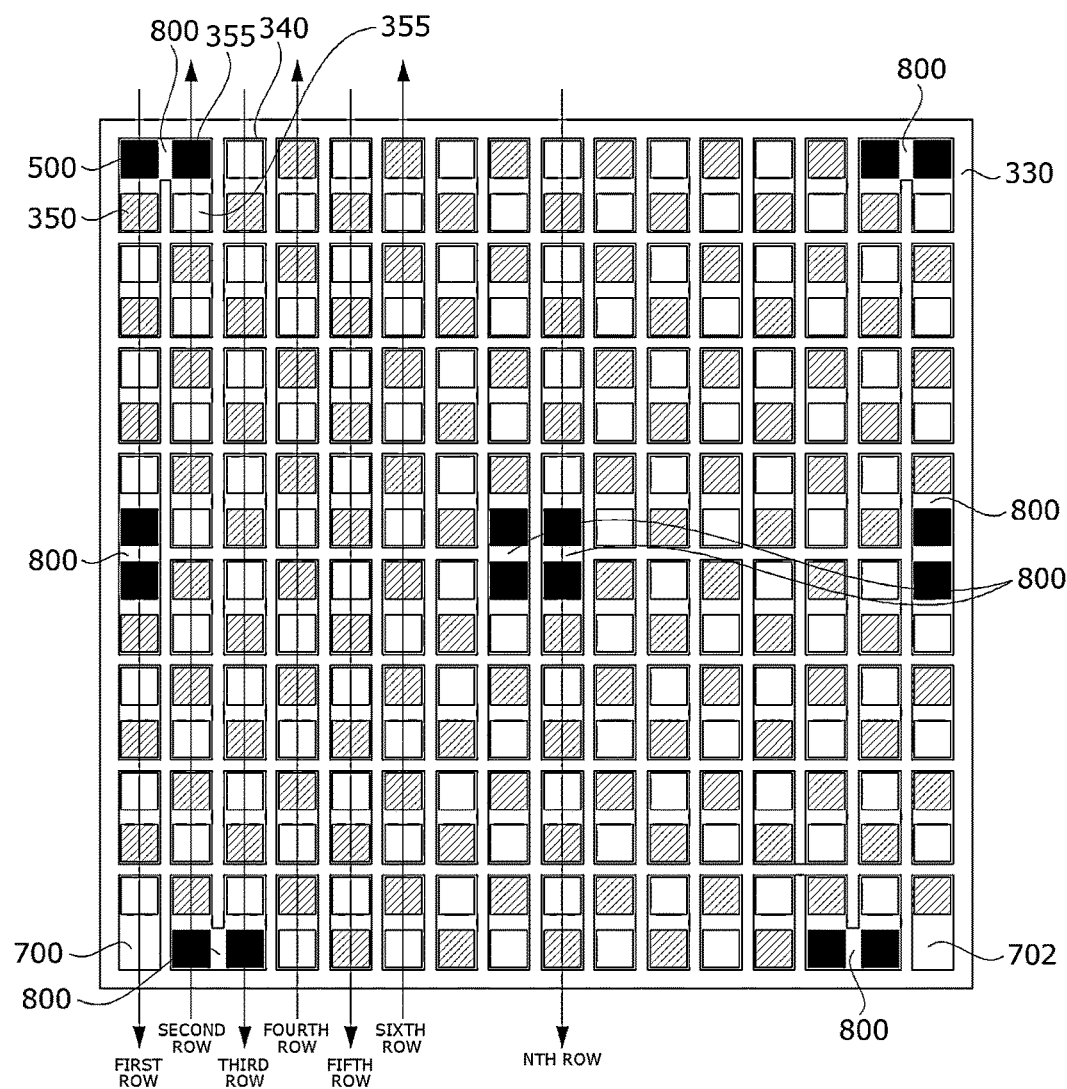

[FIG. 9]
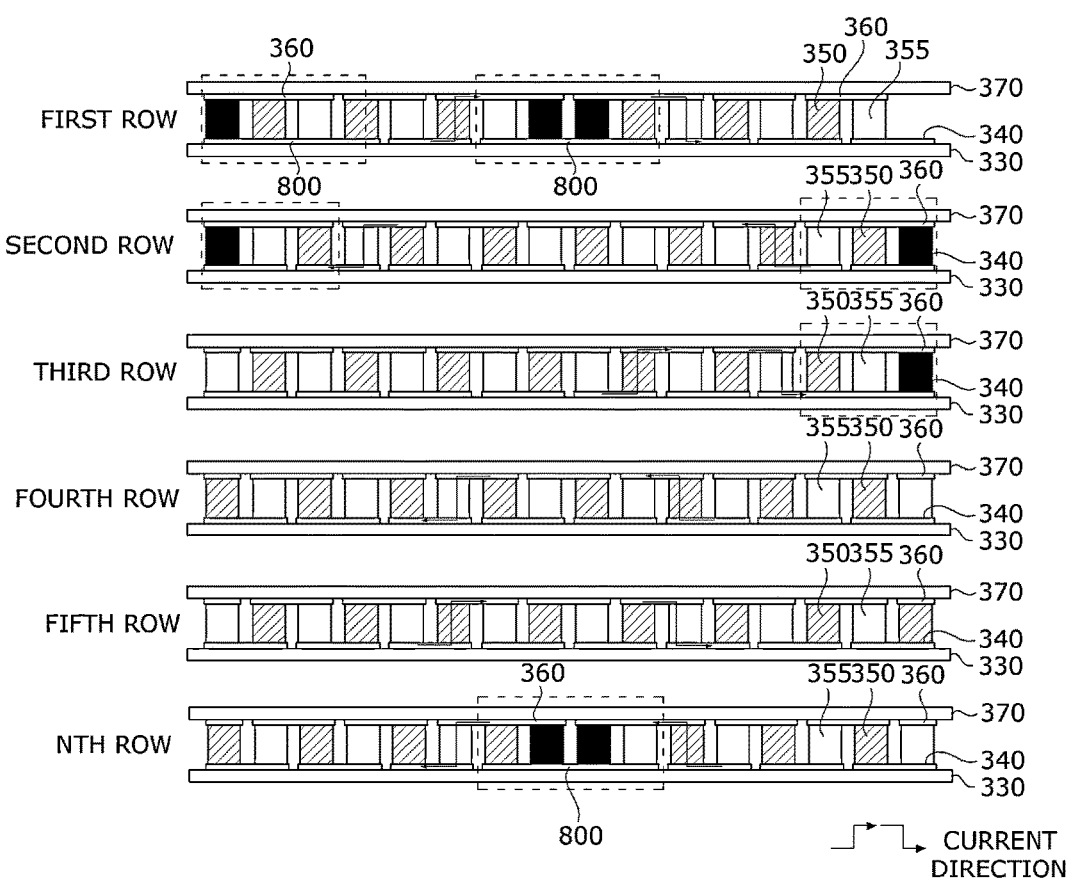

[FIG. 10A]
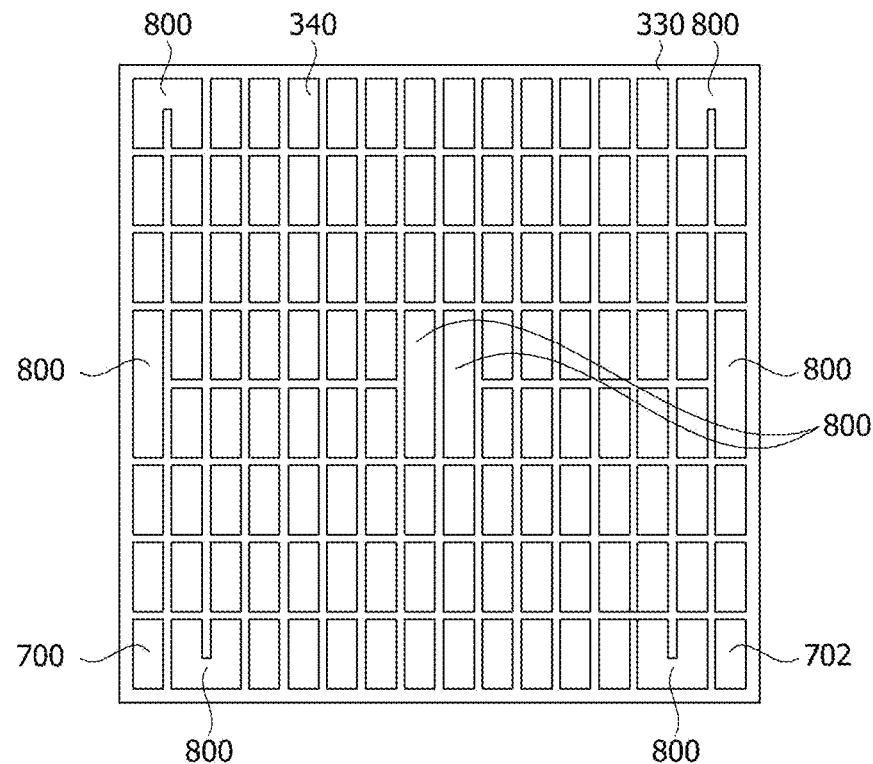
[FIG. 10B]
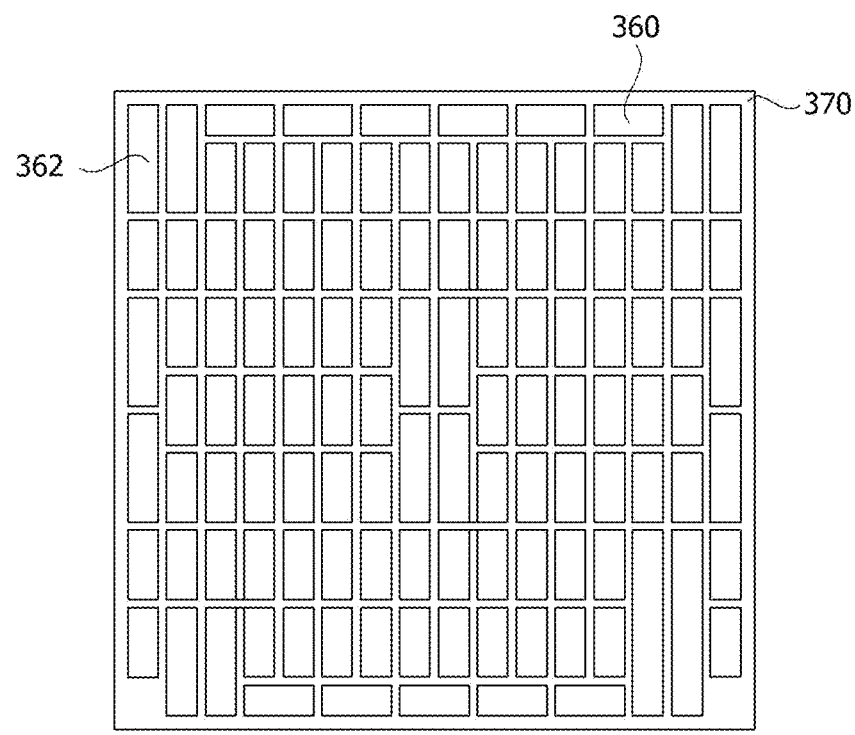

THERMOELECTRIC DEVICE

CROSS-REFERENCE TO RELATED PATENT APPLICATIONS

This application is a U.S. National Stage Application under 35 U.S.C. § 371 of PCT Application No. PCT/KR2020/001255, filed Jan. 28, 2020, which claims priority to Korean Patent Application No. 10-2019-0011801, filed Jan. 30, 2019, whose entire disclosures are hereby incorporated by reference.

TECHNICAL FIELD

The present invention relates to a thermoelectric device, and more specifically, to an arrangement structure of an electrode and a leg in a thermoelectric device.

BACKGROUND ART

A thermoelectric phenomenon is a phenomenon which occurs due to movement of electrons and holes in a material and refers to direct energy conversion between heat and electricity.

A thermoelectric device is a generic term for a device using the thermoelectric phenomenon and has a structure in which a P-type thermoelectric material and an N-type thermoelectric material are joined between metal electrodes to form a PN junction pair.

Thermoelectric devices can be classified into a device using temperature changes of electrical resistance, a device using the Seebeck effect, which is a phenomenon in which an electromotive force is generated due to a temperature difference, a device using the Peltier effect, which is a phenomenon in which heat absorption or heat generation occurs due to current, and the like.

The thermoelectric device is variously applied to home appliances, electronic components, communication components, or the like. For example, the thermoelectric device can be applied to a cooling device, a heating device, a power generation device, or the like. Accordingly, the demand for thermoelectric performance of the thermoelectric device is increasing more and more.

The thermoelectric device includes substrates, electrodes, and thermoelectric legs, a plurality of thermoelectric legs are disposed between the substrates, and the electrodes are disposed between the plurality of thermoelectric legs and the substrates. In this case, the electrodes connect the plurality of thermoelectric legs in series. For example, one pair of a P-type thermoelectric leg and an N-type thermoelectric leg can be disposed on one electrode, and the N-type thermoelectric leg can be disposed on another electrode together with another P-type thermoelectric leg. The electrodes and the thermoelectric legs can be bonded by solder.

When the thermoelectric device is driven, a temperature of a high-temperature part increases, and accordingly, the substrate and the electrode at the high-temperature part thermally expand relatively larger than the substrate and the electrode at a low-temperature part. Accordingly, stress is generated in a bonding surface between the electrode and the thermoelectric leg at the high-temperature part, and thus the thermoelectric leg can be tilted. When the thermoelectric leg is tilted, cracks can occur in the thermoelectric leg or a short circuit can occur between the thermoelectric leg and the electrode, and accordingly, reliability and performance of the thermoelectric device can be degraded.

DISCLOSURE

Technical Problem

The present invention is directed to providing an arrangement structure of an electrode and a leg in a thermoelectric device.

Technical Solution

A thermoelectric device according to one embodiment of the present invention includes: a first substrate; a first electrode disposed on the first substrate; a P-type thermoelectric leg, an N-type thermoelectric leg, and an insulating leg disposed on the first electrode; a second electrode disposed on the P-type thermoelectric leg, the N-type thermoelectric leg, and the insulating leg; and a second substrate disposed on the second electrode, wherein the first electrode includes a plurality of first electrodes, the second electrode includes a plurality of second electrodes, one pair of the P-type thermoelectric leg and the N-type thermoelectric leg are disposed on each of at least some of the plurality of first electrodes, each of the P-type thermoelectric leg and the N-type thermoelectric leg includes a first plating layer, a thermoelectric material layer disposed on the first plating layer and including a thermoelectric material, and a second plating layer disposed on the thermoelectric material layer, the insulating leg includes a third plating layer, an insulating layer disposed on the third plating layer and including a polymer resin, and a fourth plating layer disposed on the insulating layer, and a modulus of elasticity of the insulating leg is 3 to 1000 MPa.

The first plating layer and the third plating layer may be made of the same material, and the second plating layer and the fourth plating layer may be made of the same material.

The insulating layer may include a silicone-based polymer resin.

The insulating layer may include the silicone-based polymer resin and may include a plurality of resin layers which are sequentially stacked.

The insulating layer may further include a metal layer disposed between the plurality of resin layers.

At least one insulating leg may be disposed on an independent electrode on which the P-type thermoelectric leg and the N-type thermoelectric leg are not disposed among the plurality of first electrodes, and the independent electrode may not be electrically connected.

The insulating leg may be disposed on at least one of the plurality of electrodes disposed in an edge column or an edge row among the plurality of first electrodes.

The first electrode may include a first terminal connection electrode disposed at one corner of the plurality of first electrodes and a second terminal connection electrode disposed at another corner of the same row as the first terminal connection electrode, and the insulating legs may be disposed on electrodes disposed at another corner of the same column as the first terminal connection electrode and another corner of the same column as the second terminal connection electrode.

The first electrode may include a first terminal connection electrode disposed at one edge of the plurality of first electrodes and a second terminal connection electrode disposed at another corner of the same row as the first terminal connection electrode, and the insulating leg may be disposed on an electrode disposed adjacent to the first terminal connection electrode in the same row as the first terminal connection electrode or an electrode disposed adjacent to the second terminal connection electrode in the same row as the second terminal connection electrode.

The insulating leg may be disposed on an electrode disposed in a region where a middle row and a middle column among the plurality of first electrodes meet.

At least one insulating leg may be disposed next to the P-type thermoelectric leg or the N-type thermoelectric leg on one first electrode on which at least one of the P-type thermoelectric leg and the N-type thermoelectric leg is disposed.

A plurality of insulating legs may be disposed on any one first electrode on which one pair of the P-type thermoelectric leg and the N-type thermoelectric leg are disposed.

Advantageous Effects

According to an embodiment of the present invention, a thermoelectric device having excellent performance and high reliability can be obtained. Specifically, according to the embodiment of the present invention, a problem in that cracks are generated in a thermoelectric leg or a short circuit is generated between the thermoelectric leg and an electrode can be prevented.

The thermoelectric device according to an embodiment of the present invention can be applied to not only applications implemented in a small size, but also applications implemented in a large size such as a vehicle, a ship, a steel mill, an incinerator, and the like.

DESCRIPTION OF DRAWINGS

FIGS. 1A and 1B are cross-sectional views of a thermoelectric device.

FIG. 2 is a perspective view of the thermoelectric device.

FIG. 3 is a cross-sectional view of a thermoelectric apparatus according to one embodiment of the present invention.

FIG. 4 illustrates positions of electrodes for simulating stress applied between electrodes and thermoelectric legs.

FIG. 5A is a perspective view of an insulating leg according to one embodiment of the present invention.

FIG. 5B is a perspective view of an insulating leg according to another embodiment of the present invention.

FIG. 6 illustrates the thermoelectric legs and insulating legs disposed on a substrate and electrodes according to one embodiment of the present invention.

FIG. 7 is an arrangement diagram of the electrodes in the embodiment of FIG. 6.

FIG. 8 illustrates thermoelectric legs and insulating legs disposed on a substrate and electrodes according to another embodiment of the present invention.

FIG. 9 is a cross-sectional view for each column of FIG. 8.

FIGS. 10A and 10B are arrangement diagrams of the electrodes in the embodiment of FIG. 8.

MODES OF THE INVENTION

Hereinafter, preferred embodiments of the present invention will be described in detail with reference to the accompanying drawings.

However, the technical spirit of the present invention is not limited to some embodiments which will be described and may be embodied in various forms, and one or more elements in the embodiments may be selectively combined and replaced to be used within the scope of the technical spirit of the present invention.

Further, terms used in the embodiments of the present invention (including technical and scientific terms), may be interpreted with meanings that are generally understood by those skilled in the art unless particularly defined and described, and terms which are generally used, such as terms defined in a dictionary, may be understood in consideration of their contextual meanings in the related art.

In addition, terms used in the description are provided not to limit the present invention but to describe the embodiments.

In the specification, the singular form may also include the plural form unless the context clearly indicates otherwise and may include one or more of all possible combinations of A, B, and C when disclosed as at least one (or one or more) of "A, B, and C".

Further, terms such as first, second, A, B, (a), (b), and the like may be used to describe elements of the embodiments of the present invention.

The terms are only provided to distinguish an element from other elements, and the essence, sequence, order, or the like of the elements are not limited by the terms.

Further, when a particular element is disclosed as being "connected," "coupled," or "linked" to another element, this may not only include a case of the element being directly connected, coupled, or linked to the other element but also a case of the element being connected, coupled, or linked to the other element by another element between the element and the other element.

In addition, when one element is disclosed as being formed "on or under" another element, the term "on or under" includes both a case in which the two elements are in direct contact with each other and a case in which at least another element is disposed between the two elements (indirectly). Further, when the term "on or under" is expressed, a meaning of not only an upward direction but also a downward direction may be included based on one element.

FIG. 1 is a cross-sectional view of a thermoelectric device, and FIG. 2 is a perspective view of the thermoelectric device.

Referring to FIGS. 1 and 2, a thermoelectric device 100 includes a lower substrate 110, lower electrodes 120, P-type thermoelectric legs 130, N-type thermoelectric legs 140, upper electrodes 150, and an upper substrate 160.

The lower electrodes 120 are disposed between the lower substrate 110 and lower surfaces of the P-type thermoelectric legs 130 and the N-type thermoelectric legs 140, and the upper electrodes 150 are disposed between the upper substrate 160 and upper surfaces of the P-type thermoelectric legs 130 and the N-type thermoelectric legs 140. Accordingly, the plurality of P-type thermoelectric legs 130 and the plurality of N-type thermoelectric legs 140 are electrically connected by the lower electrodes 120 and the upper electrodes 150. One pair of the P-type thermoelectric leg 130 and the N-type thermoelectric leg 140 which are disposed between the lower electrodes 120 and the upper electrode 150 and electrically connected to each other may form a unit cell.

For example, when a voltage is applied to the lower electrodes 120 and the upper electrodes 150 through lead lines 181 and 182, a substrate through which a current flows from the P-type thermoelectric legs 130 to the N-type thermoelectric legs 140 due to the Peltier effect may absorb heat to function as a cooling part, and a substrate through which a current flows from the N-type thermoelectric legs 140 to the P-type thermoelectric legs 130 may be heated to function as a heating part. Alternatively, when a temperature difference between the lower electrode 120 and the upper electrode 150 is applied, charges in the P-type thermoelectric legs 130 and the N-type thermoelectric legs 140 move due to the Seebeck effect, and thus electricity may be generated.

Here, the P-type thermoelectric leg 130 and the N-type thermoelectric leg 140 may be bismuth-telluride (Bi—Te)-based thermoelectric legs including bismuth (Bi) and tellurium (Te) as main raw materials. The P-type thermoelectric leg 130 may be a bismuth-telluride (Bi—Te)-based thermoelectric leg including at least one among antimony (Sb), nickel (Ni), aluminum (Al), copper (Cu), silver (Ag), lead (Pb), boron (B), gallium (Ga), tellurium (Te), bismuth (Bi), and indium (In). For example, the P-type thermoelectric leg 130 may include Bi—Sb—Te, which is a main raw material in an amount of 99 to 99.999 wt %, and may include at least one among nickel (Ni), aluminum (Al), copper (Cu), silver (Ag), lead (Pb), boron (B), gallium (Ga), and indium (In) in an amount of 0.001 to 1 wt % based on the total weight of 100 wt %. The N-type thermoelectric leg 140 may be a bismuth-telluride (Bi—Te)-based thermoelectric leg including at least one among selenium (Se), nickel (Ni), aluminum (Al), copper (Cu), silver (Ag), lead (Pb), boron (B), gallium (Ga), tellurium (Te), bismuth (Bi), and indium (In). For example, the N-type thermoelectric leg 140 may include Bi—Se—Te, which is a main raw material in an amount of 99 to 99.999 wt %, and may include at least one among nickel (Ni), aluminum (Al), copper (Cu), silver (Ag), lead (Pb), boron (B), gallium (Ga), and indium (In) in an amount of 0.001 to 1 wt % based on the total weight of 100 wt %.

The P-type thermoelectric leg 130 and the N-type thermoelectric leg 140 may be formed in a bulk type or a stacked type. Generally, the bulk type P-type thermoelectric leg 130 or the bulk type N-type thermoelectric leg 140 may be obtained through a process of producing an ingot by heat-treating a thermoelectric material, pulverizing and sieving the ingot to obtain powder for thermoelectric legs, sintering the powder, and cutting the sintered object. In this case, the P-type thermoelectric leg 130 and the N-type thermoelectric leg 140 may be polycrystalline thermoelectric legs. For the polycrystalline thermoelectric legs, the powder for thermoelectric legs may be compressed at 100 to 200 MPa when sintered. For example, when the P-type thermoelectric leg 130 is sintered, the powder for thermoelectric legs may be sintered at 100 to 150 MPa, preferably, 110 to 140 MPa, and more preferably, 120 to 130 MPa. Further, when the N-type thermoelectric leg 130 is sintered, the powder for thermoelectric legs may be sintered at 150 to 200 MPa, preferably, 160 to 195 MPa, and more preferably, 170 to 190 MPa. Like the above, when the P-type thermoelectric leg 130 and the N-type thermoelectric leg 140 are the polycrystalline thermoelectric legs, strength of the P-type thermoelectric leg 130 and the N-type thermoelectric leg 140 may increase. The stacked type P-type thermoelectric leg 130 or the stacked type N-type thermoelectric leg 140 may be obtained through a process of forming a unit member by coating a paste including a thermoelectric material on a sheet-shaped base material, and then stacking and cutting the unit member.

In this case, one pair of the P-type thermoelectric leg 130 and the N-type thermoelectric leg 140 may have the same shape and volume or may have different shapes and volumes. For example, since electrical conduction characteristics of the P-type thermoelectric leg 130 and the N-type thermoelectric leg 140 are different, a height or cross-sectional area of the N-type thermoelectric leg 140 may be formed differently from a height or cross-sectional area of the P-type thermoelectric leg 130.

In this case, the P-type thermoelectric leg 130 or the N-type thermoelectric leg 140 may have a cylindrical shape, a polygonal pillar shape, an oval pillar shape, and the like.

Alternatively, the P-type thermoelectric leg 130 or the N-type thermoelectric leg 140 may have a stacked structure. For example, the P-type thermoelectric leg 130 or the N-type thermoelectric leg 140 may be formed using a method of stacking a plurality of structures on which a semiconductor material is coated on a sheet-shaped base material and then cutting the structures. Accordingly, material loss may be prevented and electrical conduction characteristics may be improved. Each structure may further include a conductive layer having an opening pattern, and accordingly, it is possible to increase an adhesion force between the structures, lower thermal conductivity, and increase electrical conductivity.

Alternatively, the P-type thermoelectric leg 130 or the N-type thermoelectric leg 140 may be formed to have different cross-sectional areas in one thermoelectric leg. For example, in the one thermoelectric leg, cross-sectional areas of both end portions disposed to face the electrodes may be formed larger than a cross-sectional area between both end portions. Accordingly, since a temperature difference between both end portions may be formed to be large, thermoelectric efficiency may increase.

The performance of the thermoelectric device according to one embodiment of the present invention may be expressed as a thermoelectric performance index (a figure of merit, ZT). The thermoelectric performance index (ZT) may be expressed as in Equation 1.

$$ZT = \alpha^2 \cdot \sigma \cdot T / k \qquad \text{[Equation 1]}$$

Here, a is the Seebeck coefficient [V/K], a is electrical conductivity [S/m], and $\alpha 2\sigma$ is a power factor (W/mK2]). Further, T is a temperature, and k is thermal conductivity [W/mK]. k may be expressed as a•cp•p, wherein a is thermal diffusivity [cm2/S], cp is specific heat [J/gK], and ρ is density [g/cm3].

In order to obtain the thermoelectric performance index of the thermoelectric device, a Z value (V/K) is measured using a Z meter, and the thermoelectric performance index (ZT) may be calculated using the measured Z value.

Here, the lower electrodes 120 disposed between the lower substrate 110 and the P-type thermoelectric legs 130 and the N-type thermoelectric legs 140, and the upper electrodes 150 disposed between the upper substrate 160 and the P-type thermoelectric legs 130 and the N-type thermoelectric legs 140 may each include at least one of copper (Cu), silver (Ag), aluminum (Al), and nickel (Ni) and each have a thickness of 0.01 mm to 0.3 mm. When the thickness of the lower electrode 120 or the upper electrode 150 is smaller than 0.01 mm, a function as an electrode may be degraded and thus electrical conduction performance may be lowered, and when the thickness of the lower electrode 120 or the upper electrode 150 is greater than 0.3 mm, conduction efficiency may be lowered due to an increase in resistance.

Further, the lower substrate 110 and the upper substrate 160 facing each other may be insulating substrates or metal substrates. When the lower substrate 110 and the upper substrate 160 are metal substrates, the lower substrate 110 and the upper substrate 160 may include Cu, Al, a Cu alloy, an Al alloy, or a Cu—Al alloy, and the thickness may range from 0.1 mm to 1.5 mm. When the thickness of the metal substrate is smaller than 0.1 mm or greater than 1.5 mm, since heat dissipation characteristics or thermal conductivity may be excessively high, reliability of the thermoelectric device may be degraded. Further, when the lower substrate 110 and the upper substrate 160 are the metal substrates, insulating layers 170 may be further formed between the lower substrate 110 and the lower electrodes 120 and between the upper substrate 160 and the upper electrodes 150. Each of the insulating layers 170 may include a material having a thermal conductivity of 5 to 20 W/mK and may be formed to a thickness of 0.01 mm to 0.35 mm. When the thickness of the insulating layer 170 is smaller than 0.01 mm, insulation efficiency or withstand voltage characteristics may be degraded, and when the thickness of the insulating layer 170 is greater than 0.35 mm, since thermal conductivity is lowered, heat dissipation efficiency may be degraded.

The insulating layer 170 may be made of an epoxy resin composition including an epoxy resin and an inorganic filler or may be made of a silicone resin composition including polydimethylsiloxane (PDMS) to improve an insulating property, a bonding strength, and heat dissipation performance with the lower substrate 110 or the upper substrate 160.

Here, the inorganic filler may be included in an amount of 68 to 88 vol % of the insulating layer 170. When the inorganic filler is included in an amount less than 68 vol %, a heat conduction effect may be low, and when the inorganic filler is included in an amount greater than 88 vol %, the insulating layer 170 may be easily broken.

Further, the epoxy resin may include an epoxy compound and a curing agent. In this case, the curing agent may be included in a volume ratio of 1 to 10 based on a volume ratio of 10 of the epoxy compound. Here, the epoxy compound may include at least one of a crystalline epoxy compound, an amorphous epoxy compound, and a silicone epoxy compound. The inorganic filler may include aluminum oxide and nitride, and the nitride may be included in an amount of 55 to 95 wt % and, preferably, 60 to 80 wt % of the inorganic filler. When the nitride is included in this numerical range, the thermal conductivity and the bonding strength may be increased. Here, the nitride may include at least one of boron nitride and aluminum nitride.

In this case, a particle size (D50) of a boron nitride agglomerate may be 250 to 350 m, and a particle size (D50) of the aluminum oxide may be 10 to 30 m. When the particle size (D50) of the boron nitride agglomerate and the particle size (D50) of the aluminum oxide satisfy these numerical ranges, the boron nitride agglomerate and the aluminum oxide may be uniformly dispersed in the insulating layer 170, and accordingly, it is possible to have a uniform heat conduction effect and adhesion performance throughout the insulating layer 170.

In this case, the lower substrate 110 and the upper substrate 160 may be formed to have different sizes. For example, a volume, a thickness, or an area of one of the lower substrate 110 and the upper substrate 160 may be formed to be larger than a volume, a thickness, or an area of the other one. Accordingly, it is possible to increase the heat absorption performance or heat dissipation performance of the thermoelectric device. Preferably, the volume, thickness, or area of the lower substrate 110 may be formed to be larger than at least one of the volume, thickness, or area of the upper substrate 160. In this case, the lower substrate 110 may be formed to have at least one of the volume, thickness, or area larger than that of the upper substrate 160 when the lower substrate 110 is disposed in a high-temperature region for the Seebeck effect, when the lower substrate 110 is applied as a heating region for the Peltier effect, or when a sealing member for protection from an external environment of a thermoelectric module which will be described later is disposed on the lower substrate 110. At this time, the area of the lower substrate 110 may be formed in a range of 1.2 to 5 times the area of the upper substrate 160. When the area of the lower substrate 110 is less than 1.2 times that of the upper substrate 160, an effect on enhancement of heat transfer efficiency is not high, and when the area of the lower substrate 110 exceeds 5 times that of the upper substrate 160, the heat transfer efficiency is significantly lowered, and a basic shape of the thermoelectric module may be difficult to maintain.

When the lower substrate 110 and the upper substrate 160 are insulating substrates, the lower substrate 110 and the upper substrate 160 may be alumina substrates or polymer resin substrates. The polymer resin substrate may include various insulating resin materials such as polyimide (PI), polystyrene (PS), polymethyl methacrylate (PMMA), cyclic olefin copolymer (COC), polyethylene terephthalate (PET), high transmissive plastic such as a resin, and the like and may have flexibility.

A thickness of the insulating layer 170 may range from 0.02 to 0.6 mm, preferably, 0.1 to 0.6 mm, and more preferably, 0.2 to 0.6 mm, and the thermal conductivity may be 1 W/mK or more, preferably, 10 W/mK or more, and more preferably, 20 W/mK or more. When the thickness of the insulating layer 170 satisfies this numerical range, even when the lower substrate 110 or the upper substrate 160 repeatedly contracts and expands according to a temperature change, heat dissipation, insulation and a bonding strength with the thermoelectric leg or metal support may not be affected.

Further, one of the lower substrate 110 and the upper substrate 160 may be a metal substrate, and the other may be an insulating substrate.

Further, a heat dissipation pattern, for example, an uneven pattern, may be formed on a surface of at least one of the lower substrate 110 and the upper substrate 160. Accordingly, the heat dissipation performance of the thermoelectric device may be increased. When the uneven pattern is formed on a surface which comes into contact with the P-type thermoelectric leg 130 or the N-type thermoelectric leg 140, a bonding characteristic between the thermoelectric leg and the substrate may also be enhanced. The thermoelectric device 100 includes the lower substrate 110, the lower electrodes 120, the P-type thermoelectric legs 130, the N-type thermoelectric legs 140, the upper electrodes 150, and the upper substrate 160.

Although not shown in the drawings, a sealing member may be further disposed between the lower substrate 110 and the upper substrate 160. The sealing member may be disposed on side surfaces of the lower electrodes 120, the P-type thermoelectric leg 130, the N-type thermoelectric leg 140, and the upper electrode 150 between the lower substrate 110 and the upper substrate 160. Accordingly, the lower electrodes 120, the P-type thermoelectric leg 130, the N-type thermoelectric leg 140, and the upper electrode 150 may be sealed from external moisture, heat, contamination, and the like. Here, the sealing member may include a sealing case disposed to be spaced a predetermined distance apart from side surfaces of the outermost portion of the plurality of lower electrodes 120, the outermost portion of the plurality of P-type thermoelectric legs 130 and the plurality of N-type thermoelectric legs 140, and the outermost portion of the plurality of upper electrodes 150, a sealing material disposed between the sealing case and the lower substrate 110, and a sealing material disposed between the sealing case and the upper substrate 160. Like the above, the sealing case may come into contact with the lower substrate 110 and the upper substrate 160 through the sealing materials. Accordingly, when the sealing case comes into direct contact with the lower substrate 110 and the upper substrate 160, heat conduction occurs through the sealing case, and thus, a problem in that the temperature difference between the lower substrate 110 and the upper substrate 160 is lowered may be prevented. Here, the sealing materials may include at least one of an epoxy resin and a silicone resin, or a tape of which both surfaces are coated with at least one of the epoxy resin and the silicone resin. The sealing materials may serve to form an airtight seal between the sealing case and the lower substrate 110 and between the sealing case and the upper substrate 160, may increase a sealing effect of the lower electrodes 120, the P-type thermoelectric leg 130, the N-type thermoelectric leg 140, and the upper electrode 150, and may be interchanged with a finishing material, a finishing layer, a waterproofing material, a waterproofing layer, and the like. Here, the sealing material which seals between the sealing case and the lower substrate 110 may be disposed on an upper surface of the lower substrate 110, and the sealing material which seals between the sealing case and the upper substrate 160 may be disposed on a side surface of the upper substrate 160. To this end, the area of the lower substrate 110 may be larger than the area of the upper substrate 160. Meanwhile, guide grooves G, through which lead lines 180 and 182 connected to the electrodes are withdrawn, may be formed in the sealing case. To this end, the sealing case may be an injection-molded product formed of plastic or the like and may be interchanged with a sealing cover. However, the above description of the sealing member is only an example, and the sealing member may be modified into various forms. Although not shown, a heat insulating material may be further included to surround the sealing member. Alternatively, the sealing member may include a heat insulating component.

Meanwhile, the P-type thermoelectric legs 130 and the N-type thermoelectric legs 140 may have a structure shown in FIG. 1A or 1B. Referring to FIG. 1A, the thermoelectric legs 130 and 140 may respectively include thermoelectric material layers 132 and 142, first plating layers 134-1 and 144-1 stacked on one surfaces of the thermoelectric material layers 132 and 142, and second plating layers 134-2 and 144-2 stacked on the other surfaces disposed opposite the one surfaces of the thermoelectric material layers 132 and 142. Alternatively, referring to FIG. 1B, the thermoelectric legs 130 and 140 may respectively include thermoelectric material layers 132 and 142, first plating layers 134-1 and 144-1 stacked on one surfaces of the thermoelectric material layers 132 and 142, second plating layers 134-2 and 144-2 stacked on the other surfaces disposed opposite the one surfaces of the thermoelectric material layers 132 and 142, and first buffer layers 136-1 and 146-1 and second buffer layers 136-2 and 146-2 respectively disposed between the thermoelectric material layers 132 and 142 and the first plating layers 134-1 and 144-1 and between the thermoelectric material layers 132 and 142 and the second plating layers 134-2 and 144-2. Alternatively, the thermoelectric legs 130 and 140 may further include metal layers respectively stacked between the first plating layers 134-1 and 144-1 and the lower substrate 110 and between the second plating layers 134-2 and 144-2 and the upper substrate 160.

Here, the thermoelectric material layers 132 and 142 may include bismuth (Bi) and tellurium (Te), which are semiconductor materials. The thermoelectric material layers 132 and 142 may have the same material or shape as the aforementioned P-type thermoelectric legs 130 or N-type thermoelectric legs 140. When the thermoelectric material layers 132 and 142 are polycrystalline, a bonding strength between the thermoelectric material layers 132 and 142, the first buffer layers 136-1 and 146-1, and the first plating layers 134-1 and 144-1, and a bonding strength between the thermoelectric material layers 132 and 142, the second buffer layers 136-2 and 146-2, and the second plating layers 134-2 and 144-2 may increase. Accordingly, even when the thermoelectric device 100 is applied to an application in which vibration occurs, for example, a vehicle or the like, a problem in that the first plating layers 134-1 and 144-1 and the second plating layers 134-2 and 144-2 are separated from the P-type thermoelectric leg 130 or the N-type thermoelectric leg 140 and carbonized may be prevented, and durability and reliability of the thermoelectric device 100 may be increased.

Further, the metal layers may be selected from copper (Cu), a copper alloy, aluminum (Al), and an aluminum alloy and may each have a thickness of 0.1 to 0.5 mm and, preferably, 0.2 to 0.3 mm.

Next, the first plating layers 134-1 and 144-1 and the second plating layers 134-2 and 144-2 may each include at least one of Ni, Sn, Ti, Fe, Sb, Cr, and Mo, and may have a thickness of 1 to 20 m, and preferably 1 to 10 m. Since the first plating layers 134-1 and 144-1 and the second plating layers 134-2 and 144-2 prevent a reaction between Bi or Te which is a semiconductor material in the thermoelectric material layers 132 and 142, and the metal layers, performance degradation of the thermoelectric device may be prevented, and oxidation of the metal layers may also be prevented.

In this case, the first buffer layers 136-1 and 146-1 and the second buffer layers 136-2 and 146-2 may be respectively arranged between the thermoelectric material layers 132 and 142 and the first plating layers 134-1 and 144-1 and between the thermoelectric material layers 132 and 142 and the second plating layers 134-2 and 144-2. In this case, the first buffer layers 136-1 and 146-1 and the second buffer layers 136-2 and 146-2 may include Te. For example, the first buffer layers 136-1 and 146-1 and the second buffer layers 136-2 and 146-2 may include at least one among Ni—Te, Sn—Te, Ti—Te, Fe—Te, Sb—Te, Cr—Te, and Mo—Te. According to the embodiment of the present invention, when the first buffer layers 136-1 and 146-1 and the second buffer layers 136-2 and 146-2 including Te are disposed between the thermoelectric material layers 132 and 142 and the first plating layers 134-1 and 144-1 and between the thermoelectric material layers 132 and 142 and the second plating layers 134-2 and 144-2, diffusion of Te in the thermoelectric material layers 132 and 142 to the first plating layers 134-1 and 144-1 and the second plating layers 134-2 and 144-2 may be prevented. Accordingly, a problem in that electrical resistance in the thermoelectric material layer increases due to a Bi-rich region may be prevented.

FIG. 3 is a cross-sectional view of a thermoelectric apparatus according to one embodiment of the present invention, and FIG. 4 illustrates positions of the electrodes for simulating stress applied between the electrodes and the thermoelectric legs.

Referring to FIG. 3, a thermoelectric device 300 includes a first metal support 310, a first bonding layer 320 disposed on the first metal support 310, and a first resin layer 330 disposed on the first bonding layer 320, a plurality of first electrodes 340 disposed on the first resin layer 330, a plurality of P-type thermoelectric legs 350 and a plurality of N-type thermoelectric legs 355 disposed on the plurality of first electrodes 340, a plurality of second electrodes 360 disposed on the plurality of P-type thermoelectric legs 350 and the plurality of N-type thermoelectric legs 355, a second resin layer 370 disposed on the plurality of second electrodes 360, a second bonding layer 380 disposed on the second resin layer 370, and a second metal support 390 disposed on the second bonding layer 380. Here, the first resin layer 330, the first electrodes 340, the P-type thermoelectric legs 350, the N-type thermoelectric legs 355, the second electrodes 360, and the second resin layer 370 may respectively correspond to the lower substrate 110, the lower electrodes 120, the P-type thermoelectric legs 130, the N-type thermoelectric legs 140, the upper electrodes 150, and the upper substrate 160 shown in FIGS. 1 and 2. Although not shown in the drawings, a heat sink may be disposed on at least one of the first metal support 310 and the second metal support 390. For example, the heat sink may be attached to a surface opposite to the surface on which the bonding layer 320 is disposed among both surfaces of the first metal support 310, and the heat sink may be attached to a surface opposite to the surface on which the bonding layer 380 is disposed among both surfaces of the second metal support 390. Alternatively, the first metal support 310 and the heat sink may be integrally formed, and the second metal support 390 and the heat sink may be integrally formed.

In the specification, the thermoelectric device may include the first metal support 310, the first resin layer 330, the first electrodes 340, the P-type thermoelectric legs 350, the N-type thermoelectric legs 355, the second electrodes 360, the second resin layer 370, and the second metal support 390. Alternatively, the thermoelectric device may include the first metal support 310 to which the heat sink is attached or integrally formed with the heat sink, the first resin layer 330, the first electrodes 340, the P-type thermoelectric legs 350, the N-type thermoelectric legs 355, the second electrodes 360, the second resin layer 370, and the second metal support 390 to which the heat sink is attached or integrally formed with the heat sink.

The first metal support 310 and the second metal support 390 may be formed of aluminum, an aluminum alloy, copper, a copper alloy, or the like. The first metal support 310 and the second metal support 390 may support the first resin layer 330, the plurality of first electrodes 340, the plurality of P-type thermoelectric leg 350 and the plurality of N-type thermoelectric leg 355, the plurality of second electrodes 360, the second resin layer 370, and the like, and may be regions which are directly attached to an application to which the thermoelectric device 300 according to the embodiment of the present invention is applied. To this end, an area of the first metal support 310 may be larger than an area of the first resin layer 330, and an area of the second metal support 390 may be larger than an area of the second resin layer 370. That is, the first resin layer 330 may be disposed in a region spaced apart from an edge of the first metal support 310 by a predetermined distance, and the second resin layer 370 may be disposed in a region spaced apart from an edge of the second metal support 370 by a predetermined distance.

The first bonding layer 320 and the second bonding layer 380 may be formed of a thermal interface material (TIM). Alternatively, the first bonding layer 320 and the second bonding layer 380 may be formed of the same resin composition as the resin composition constituting the first resin layer 330 and the second resin layer 370. That is, after applying the resin composition which is the same as the resin composition constituting the first resin layer 330 and the second resin layer 370 on the first metal support 310 and the second metal support 390 in an uncured state, the first resin layer 330 and the second resin layer 370 may be respectively bonded to the first metal support 310 and the second metal support 390 by stacking the first resin layer 330 and the second resin layer 370 in a cured state and pressing the first resin layer 330 and the second resin layer 370 at a high temperature. Accordingly, the first bonding layer 320 and the first resin layer 330, and the second bonding layer 380 and the second resin layer 370 may not be substantially distinguishable from each other, respectively.

Meanwhile, the plurality of first electrodes 340 and the plurality of second electrodes 360 may be manufactured in a method of etching a Cu substrate in an electrode shape after disposing and pressing the Cu substrate on a resin composition in a semi-cured state constituting the first resin layer 330 and the second resin layer 370. Alternatively, the plurality of first electrodes 340 and the plurality of second electrodes 360 may be manufactured in a method of disposing and pressing the plurality of first electrodes 340 and the plurality of second electrodes 360 aligned in advance on the cured resin composition constituting the first resin layer 330 and the second resin layer 370.

One pair of the P-type thermoelectric leg 350 and the N-type thermoelectric leg 355 may be disposed on each first electrode 340, and one pair of the N-type thermoelectric leg 355 and the P-type thermoelectric leg 350 may be disposed on each second electrode 360 so that one of the one pair of the P-type thermoelectric leg 350 and the N-type thermoelectric leg 355 disposed on each first electrode 340 overlaps.

Table 1 shows data simulating stress received by the electrodes and the legs during a high-temperature operation for each position in the substrate. Here, an operating temperature of the thermoelectric device was fixed at 200° C.

TABLE 1

| Position | A | B | C | D | E | F | G | H | I | J | K | L |
|---|---|---|---|---|---|---|---|---|---|---|---|---|
| Room temperature | 14.0N | 9.8N | 9.8N | 14.0N | 23.0N | 22.8N | 22.8N | 23.0N | 13.0N | 10.3N | 10.3N | 13.0N |
| Operating temperature | 16.3N | 15.3N | 15.3N | 16.4N | 19.9N | 19.6N | 19.6N | 19.9N | 17.5N | 15.5N | 15.5N | 17.5N |

Referring to Table 1 and FIG. 4, when the thermoelectric device operates, stress applied to corner regions A, D, I, and L among the plurality of first electrodes 340 is 16N or higher, and specifically, it can be seen that the stress applied to middle rows E, F, G, and H among the plurality of first electrodes 340 is 19N or higher.

Accordingly, there is a high possibility that a short circuit between the electrode and the thermoelectric leg or a crack of the thermoelectric leg occurs in the corner region or the middle region of the thermoelectric device, and thus reliability and performance of the thermoelectric device are degraded.

According to the embodiment of the present invention, more insulating legs will be disposed in a region where high thermal stress is expected to occur. Accordingly, even when a short circuit between the electrode and the insulating leg occurs due to thermal stress, an electric flow of the thermoelectric device is not affected, and the thermoelectric device may be driven normally.

FIG. 5A is a perspective view of the insulating leg according to one embodiment of the present invention, and FIG. 5B is a perspective view of an insulating leg according to another embodiment of the present invention.

Referring to FIGS. 5A and 5B, an insulating leg 500 refers to a leg having the same shape, area, and height as the thermoelectric leg, but electrically insulated and having lower thermal conductivity than the thermoelectric leg. In the specification, since the insulating leg 500 is electrically insulated and thus does not affect the current flow in the thermoelectric device and performs a function of supporting between the lower substrate and the upper substrate in place of the thermoelectric leg in the region of high thermal stress, the insulating leg 500 may be referred to as a dummy leg. Here, a case in which the height of the insulating leg 500 and the height of the thermoelectric leg are the same may mean that the height of the insulating leg 500 is the same as the height of the thermoelectric leg or similar to the height of the thermoelectric leg within an error range of about 1%. In this case, the insulating leg 500 may have elasticity. For example, modulus of the elasticity of the insulating leg 500 may be 3 to 1000 MPa, preferably, 5 to 500 MPa, and more preferably, 5 to 150 MPa. When the modulus of the elasticity exceeds an upper limit of this numerical range, the insulating leg may be broken, and when the modulus of the elasticity is less than a lower limit, the insulating leg 500 may be difficult to support between the lower substrate and the upper substrate.

Here, a unit of the modulus of the elasticity may be converted to Young's Modulus, which is a ratio of stress to a deformation degree within an elastic range, and the unit may be kN/mm2.

Like the above, when the insulating leg 500 has the elasticity, even when a substrate of a high-temperature part contracts or expands due to heat, the insulating leg 500 is not damaged and maintains an original shape, and thus may serve as a buffer according to thermal deformation.

According to the embodiment of the present invention, the insulating leg 500 may include a third plating layer 510, an insulating layer 530 disposed on the third plating layer 510, and a fourth plating layer 520 disposed on the insulating layer 530.

In this case, the third plating layer 510 may be disposed between the first electrode 340 and the insulating layer 530, the fourth plating layer 520 may be disposed between the insulating layer 530 and the second electrode 360, the third plating layer 510 may come into direct contact with the first electrode 340, and the fourth electrode 520 may come into direct contact with the second electrode 360.

Further, the third plating layer 510 may be made of the same material as the first plating layers 134-1 and 144-1 disposed on one surface of the thermoelectric material layers 132 and 142 shown in FIG. 1, and the fourth plating layer 520 may be made of the same material as the second plating layers 134-2 and 144-2 disposed on the other surfaces of the thermoelectric material layers 132 and 142 shown in FIG. 1. For example, at least one of the third plating layer 510 and the fourth plating layer 520 may include at least one of Ni, Sn, Ti, Fe, Sb, Cr, and Mo. Alternatively, as described above, when the thermoelectric leg further includes metal layers stacked between each of the first plating layers 134-1 and 144-1 and the second plating layers 134-2 and 144-2, and each of the lower substrate 110 and the upper substrate 160, each of the third plating layer 510 and the fourth plating layer 520 may be made of the same material as the metal layer. For example, at least one of the third plating layer 510 and the fourth plating layer 520 may include at least one of copper (Cu), a copper alloy, aluminum (Al), and an aluminum alloy.

Accordingly, since an electrode bonding surface of the insulating leg has the same characteristic as an electrode bonding surface of the thermoelectric leg, the insulating leg and the thermoelectric leg may be simultaneously bonded to the electrode under the same conditions, and since soldering between the insulating leg and the electrode is facilitated, the bond strength may increase.

In this case, a height of the third plating layer 510 and a height of the fourth plating layer 520 may be the same, and the sum of the height of the third plating layer 510 and the height of the fourth plating layer 520 may be 0.01 to 0.5 times a total height of the insulating leg 530. When the sum of the height of the third plating layer 510 and the height of the fourth plating layer 520 is less than a lower limit of this numerical range, the bonding strength between the insulating leg and the electrode may be lowered, and when an upper limit of this numerical range is exceeded, insulation performance and thermal insulation performance of the insulation leg may be lowered.

According to embodiment of the present invention, the insulating layer 530 may be disposed between the third plating layer 510 and the fourth plating layer 520. The insulating layer 530 may include a polymer resin. For example, the polymer resin may include a silicone-based polymer resin. For example, the silicone-based polymer resin may include polydimethylsiloxane (PDMS). Like the above, the insulating layer 530 may have low thermal conductivity, high insulation performance, and high elasticity when including the silicone-based polymer resin, for example, PDMS.

In this case, the insulating layer 530 may be formed as a single layer as shown in FIG. 5A or as a plurality of sequentially stacked layers as shown in FIG. 5B. In this case, the plurality of layers may include first layers 532 and second layers 534 which are alternately arranged. Here, the first layers 532 and the second layers 534 may be resin layers made of the same material. Alternatively, the first layers 532 and the second layers 534 may be resin layers made of different materials. For example, the first layers 532 may be resin layers including PDMS, and the second layers 534 may be resin layers made of different materials. Alternatively, the first layers 532 may be resin layers including PDMS, and the second layers 534 may be metal layers.

Like the above, when the insulating layer 530 includes the plurality of sequentially stacked layers, thermal conductivity performance may be further lowered by each interface between the layers, and each interface between the layers may serve as a buffer for thermal deformation. Further, when the insulating layer 530 includes the plurality of sequentially stacked layers, the height of the insulating leg 500 may be easily adjusted to be the same as the height of the thermoelectric leg. For example, the insulating leg having the same height as the thermoelectric leg may be obtained by repeating a process of grinding the second layer 534 after disposing the first layer 532 on the first plating layer 510 and disposing the second layer 534 on the first layer 532.

FIG. 6 illustrates the thermoelectric legs and the insulating legs disposed on the substrate and the electrodes according to one embodiment of the present invention, and FIG. 7 is an arrangement diagram of the electrodes in the embodiment of FIG. 6.

Referring to FIGS. 6 and 7, one pair of the P-type thermoelectric leg 350 and the N-type thermoelectric leg 355 are disposed on some of the plurality of first electrodes 340. Further, at least one insulating leg 500 may be disposed on an electrode 600 on which neither the P-type thermoelectric leg 350 or the N-type thermoelectric leg 355 among the plurality of first electrodes 340 is disposed. In this case, the electrode 600 on which neither the P-type thermoelectric leg 350 or the N-type thermoelectric leg 355 is disposed among the plurality of first electrodes 340 may be an electrode which is not electrically connected, and accordingly, in the specification, the electrode 600 may be referred to as an independent electrode 600. An electric flow in the thermoelectric device may be achieved through the remaining electrodes except for the independent electrode 600.

The plurality of second electrodes 360 on the upper substrate may also include independent electrodes (not shown), and the independent electrodes included in the first electrodes and the independent electrodes included in the second electrodes may be disposed to be symmetrical to each other.

In this case, the independent electrodes 600 may be disposed in an edge column or an edge row among the plurality of first electrodes 340 or may be disposed in a middle column and a middle row. Here, the edge column or edge row may refer to an outermost column or row or may refer to a column or row disposed immediately adjacent to the outermost column or row. Further, the middle column or row may refer to a column or row disposed in the middle or a column or row disposed immediately adjacent to the column or row disposed in the middle.

For example, when a first terminal connection electrode 700 is disposed at one corner of the plurality of first electrodes 340, and a second terminal connection electrode 702 is disposed at another corner of the same row as the first terminal connection electrode 700, the independent electrodes 600 may be disposed at another corner of the same column as the first terminal connection electrode 700 and at another corner of the same column as the second terminal connection electrode 702. Further, the independent electrode 600 may be disposed adjacent to the first terminal connection electrode 700 in the same row as the first terminal connection electrode 700 or may be disposed adjacent to the second terminal connection electrode 702 in the same row as the second terminal connection electrode 702.

As shown in Table 1 and FIG. 4, since the A region, the D region, the I region, and the L region are regions where stress increases when the thermoelectric device is driven, possibility of breakage of the thermoelectric leg or a short circuit between the thermoelectric leg and the electrode is high. Accordingly, in the case in which the independent electrode 600 is disposed adjacent to the corner of the thermoelectric device with a high possibility of breakage or a short circuit of the thermoelectric leg, even when the insulating leg 500 is damaged or the insulating leg 500 is separated from the independent electrode 600, the current flow of the thermoelectric device is not affected, and the thermoelectric device may be normally driven.

Further, as shown in Table 1 and FIG. 4, since the E region, the F region, the G region, and the H region are regions where stress increases when the thermoelectric device is driven, possibility of breakage of the thermoelectric leg or a short circuit between the thermoelectric leg and the electrode is high. Accordingly, although not shown, in the case in which the independent electrode 600 is disposed adjacent to a middle region of the thermoelectric device with a high possibility of breakage or a short circuit of the thermoelectric leg, even when the insulating leg 500 is damaged or the insulating leg 500 is separated from the independent electrode 600, the current flow of the thermoelectric device is not affected, and the thermoelectric device may be normally driven.

At least one insulating leg 500 may be disposed on one independent electrode 600. In FIG. 6, an example in which two independent electrodes 600 are disposed at each corner and two insulating legs 500 are disposed on each independent electrode 600 is described, but the present invention is not limited thereto. The two independent electrodes 600 may be merged into one independent electrode, and four insulating legs 500 may be disposed on one independent electrode, and one insulating leg of a size in which the four insulating legs 500 are merged may be disposed.

FIG. 8 illustrates thermoelectric legs and insulating legs disposed on a substrate and electrodes according to another embodiment of the present invention, FIG. 9 is a cross-sectional view for each column of FIG. 8, and FIG. 10 is an arrangement diagram of the electrodes in the embodiment of FIG. 8.

Referring to FIGS. 8 to 10, one pair of a P-type thermoelectric leg 350 and a N-type thermoelectric leg 355 are disposed on some of a plurality of first electrodes 340. Further, at least one insulating leg 500 may be disposed next to the P-type thermoelectric leg 350 or the N-type thermoelectric leg 355 on an electrode, on which at least one of the P-type thermoelectric leg 350 and the N-type thermoelectric leg 355 is disposed, among the plurality of first electrodes 340.

In the specification, an electrode 800 on which the insulating leg 500 is disposed together with the P-type thermoelectric leg 350 or the N-type thermoelectric leg 355 may be referred to as a parallel electrode. Since the insulating leg 500 is electrically insulated, an electric flow in the thermoelectric device may not be affected.

In this case, the parallel electrode 800 may be disposed in an edge column or an edge row among the plurality of first electrodes 340 or may be disposed in a middle column and a middle row.

FIGS. 8 to 10 illustrate an example in which one pair of the P-type thermoelectric legs 350 and the N-type thermoelectric legs 355 are disposed on the parallel electrode 800, and the insulating legs 500 are further disposed next to one pair of the P-type thermoelectric legs 350 and the N-type thermoelectric legs 355 or between one pair of the P-type thermoelectric legs 350 and the N-type thermoelectric legs 355. When the two insulating legs 500 are disposed between one pair of the P-type thermoelectric legs 350 and the N-type thermoelectric legs 355 on one parallel electrode 800, the P-type thermoelectric leg 350 and one insulating leg 500 and the other insulating leg 500 and the N-type thermoelectric leg 355 may be respectively connected to different parallel electrodes 362 adjacent to each other at the second electrode 360.

Here, when a first terminal connection electrode 700 is disposed at one corner of the plurality of first electrodes 340, and a second terminal connection electrode 702 is disposed at another corner of the same row as the first terminal connection electrode 700, the parallel electrodes 800 may be disposed at another corner of the same column as the first terminal connection electrode 700 and at another corner of the same column as the second terminal connection electrode 702. Further, the parallel electrode 800 may be disposed adjacent to the first terminal connection electrode 700 in the same row as the first terminal connection electrode 700 or may be disposed adjacent to the second terminal connection electrode 702 in the same row as the second terminal connection electrode 702.

As shown in Table 1 and FIG. 4, since the A region, the D region, the I region, and the L region are regions where stress increases when the thermoelectric device is driven, possibility of breakage of the thermoelectric leg or a short circuit between the thermoelectric leg and the electrode is high. Accordingly, in the case in which the parallel electrode 800 is disposed adjacent to the corner of the thermoelectric device with a high possibility of breakage or a short circuit of the thermoelectric leg, even when the insulating leg 500 is damaged or the insulating leg 500 is separated from the parallel electrode 800, the current flow of the thermoelectric device is not affected, and the thermoelectric device may be normally driven.

Further, as shown in Table 1 and FIG. 4, since the E region, the F region, the G region, and the H region are regions where stress increases when the thermoelectric device is driven, possibility of breakage of the thermoelectric leg or a short circuit between the thermoelectric leg and the electrode is high. Accordingly, although not shown, in the case in which the parallel electrode 800 is disposed adjacent to a middle region of the thermoelectric device with a high possibility of breakage or a short circuit of the thermoelectric leg, even when the insulating leg 500 is damaged or the insulating leg 500 is separated from the parallel electrode 800, the current flow of the thermoelectric device is not affected, and the thermoelectric device may be normally driven.

At least one, for example, at least one of the plurality of insulating legs 500, may be disposed on one parallel electrode 800. In FIGS. 8 to 10, an example in which one insulating leg 500 or two insulating legs 500 are provided on each parallel electrode 800 is described, but the present invention is not limited thereto.

The thermoelectric device according to the embodiment of the present invention may be applied to a power generation device, a cooling device, a heating device, and the like. Specifically, the thermoelectric device according to the embodiment of the present invention may be mainly applied to an optical communication module, a sensor, a medical device, a measuring device, the aerospace industry, a refrigerator, a chiller, an automobile ventilation sheet, a cup holder, a washing machine, a dryer, a wine cellar, a water purifier, a power supply device for a sensor, a thermopile, and the like Here, as an example in which the thermoelectric device according to the embodiment of the present invention is applied to a medical device, there is a polymerase chain reaction (PCR) device. The PCR device is a device for amplifying deoxyribonucleic acid (DNA) to determine a nucleotide sequence of DNA and demands precise temperature control and requires a thermal cycle. To this end, a Peltier-based thermoelectric device may be applied.

As another example in which the thermoelectric device according to the embodiment of the present invention is applied to a medical device, there is a photodetector. Here, the photodetector includes an infrared/ultraviolet ray detector, a charge coupled device (CCD) sensor, an X-ray detector, a thermoelectric thermal reference source (TTRS), and the like. The Peltier-based thermoelectric device may be applied to cool the photodetector. Accordingly, it is possible to prevent a wavelength change, an output decrease, a resolution decrease, or the like due to a temperature increase in the photodetector.

As still another example in which the thermoelectric device according to the embodiment of the present invention is applied to a medical device, there is an immunoassay field, an in vitro diagnostics field, a general temperature control and cooling system, a physical therapy field, a liquid chiller system, a blood/plasma temperature control field, or the like. Accordingly, precise temperature control is possible.

As yet another example in which the thermoelectric device according to the embodiment of the present invention is applied to a medical device, there is an artificial heart. Accordingly, power may be supplied to the artificial heart.

As an example in which the thermoelectric device according to the embodiment of the present invention is applied to the aerospace industry, there is a star tracking system, a thermal imaging camera, an infrared/ultraviolet detector, a CCD sensor, a Hubble space telescope, a TTRS, or the like. Accordingly, it is possible to maintain the temperature of an image sensor.

As another example in which the thermoelectric device according to the embodiment of the present invention is applied to the aerospace industry, there is a cooling device, a heater, a power generation device, or the like.

In addition, the thermoelectric device according to the embodiment of the present invention may be applied to other industrial fields for power generation, cooling, and heating.

Although preferable embodiments of the present invention are described above, those skilled in the art may variously modify and change the present invention within a range not departing from the spirit and area of the present invention disclosed in the claims which will be described below.

The invention claimed is:
1. A thermoelectric device comprising:
a first substrate;
a first electrode part disposed on the first substrate;
a P-type thermoelectric leg, an N-type thermoelectric leg, and an insulating leg disposed on the first electrode part;
a second electrode part disposed on the P-type thermoelectric leg, the N-type thermoelectric leg, and the insulating leg; and
a second substrate disposed on the second electrode part,
wherein the first electrode part includes a plurality of first electrodes,
the second electrode part includes a plurality of second electrodes,
each of the P-type thermoelectric leg and the N-type thermoelectric leg includes a first plating layer, a thermoelectric material layer disposed on the first plating layer and including a thermoelectric material, and a second plating layer disposed on the thermoelectric material layer,
the insulating leg includes a third plating layer disposed on one of the plurality of first electrodes, a fourth plating layer disposed on one of the plurality of second electrodes, and a leg insulating portion disposed between the third plating layer and the fourth plating layer,
the leg insulating portion includes a plurality of resin layers made of a silicone-based polymer resin, and
the leg insulating portion further includes a metal layer disposed between two of the plurality of resin layers.

2. The thermoelectric device of claim 1, wherein:
the first plating layer and the third plating layer are made of the same material; and
the second plating layer and the fourth plating layer are made of the same material.

3. The thermoelectric device of claim 1, wherein a modulus of elasticity of the insulating leg is 3 to 1000 MPa.

4. The thermoelectric device of claim 1, wherein:
the insulating leg is disposed on an independent electrode on which the P-type thermoelectric leg and the N-type thermoelectric leg are not disposed among the plurality of first electrodes; and
the independent electrode is not electrically connected.

5. The thermoelectric device of claim 1, wherein the insulating leg is disposed on an electrode disposed in an edge column or an edge row among the plurality of first electrodes.

6. The thermoelectric device of claim 1, wherein:
the first electrode part includes a first terminal connection electrode disposed at one corner of the plurality of first electrodes and a second terminal connection electrode disposed at another corner of a same row as the first terminal connection electrode; and
the insulating leg is disposed on an electrode disposed at another corner of a same column as the first terminal connection electrode or another corner of a same column as the second terminal connection electrode.

7. The thermoelectric device of claim 1, wherein:
the first electrode part includes a first terminal connection electrode disposed at one corner of the plurality of first electrodes and a second terminal connection electrode disposed at another corner of a same row as the first terminal connection electrode; and
the insulating leg is disposed on an electrode disposed adjacent to the first terminal connection electrode in the same row as the first terminal connection electrode or an electrode disposed adjacent to the second terminal connection electrode in the same row as the second terminal connection electrode.

8. The thermoelectric device of claim 1, wherein the insulating leg is disposed on an electrode disposed in a region where a middle row and a middle column among the plurality of first electrodes meet.

9. The thermoelectric device of claim 1, wherein the insulating leg is disposed next to the P-type thermoelectric leg or the N-type thermoelectric leg on one first electrode on which the P-type thermoelectric leg or the N-type thermoelectric leg is disposed.

10. The thermoelectric device of claim 1, wherein a height of the insulating leg is the same as a height of the P-type thermoelectric leg or the N-type thermoelectric leg.

11. The thermoelectric device of claim 1, wherein a thermal conductivity of the insulating leg is lower than a thermal conductivity of the P-type thermoelectric leg or the N-type thermoelectric leg.

12. The thermoelectric device of claim 1, wherein a sum of a height of the third plating layer and a height of the fourth plating layer is 0.01 to 0.5 times a total height of the insulating leg.

13. The thermoelectric device of claim 1, wherein at least one of an area and a shape of one of the plurality of first electrodes on which the insulating leg is disposed is different from at least one of an area and a shape of another one of the plurality of first electrodes on which the insulating leg is not disposed.

14. A power generation device comprising the thermoelectric device according to claim 1.

15. A cooling and heating device comprising the thermoelectric device according to claim 1.

* * * * *